(12) United States Patent
Chung et al.

(10) Patent No.: US 6,828,512 B2
(45) Date of Patent: Dec. 7, 2004

(54) APPARATUS AND METHODS FOR INTERCONNECTING COMPONENTS TO VIA-IN-PAD INTERCONNECTS

(75) Inventors: C. Key Chung, Kodah (MY); Sook Chien Chan, Penang (MY); Kum Foo Leong, Kodah (MY)

(73) Assignee: Intel Corporation, Santa Clara, CA (US)

( * ) Notice: Subject to any disclaimer, the term of this patent is extended or adjusted under 35 U.S.C. 154(b) by 70 days.

(21) Appl. No.: 10/267,158

(22) Filed: Oct. 8, 2002

(65) Prior Publication Data

US 2004/0064942 A1 Apr. 8, 2004

(51) Int. Cl.[7] ................................................ H05K 1/16
(52) U.S. Cl. ...................... 174/260; 174/261; 174/262; 174/263; 361/760; 361/779; 361/803; 257/778
(58) Field of Search .............................. 174/262, 260, 174/261, 263, 264, 265, 266; 361/760, 768, 779, 792, 803; 29/852; 257/737, 778, 780

(56) References Cited

U.S. PATENT DOCUMENTS

| | | | | |
|---|---|---|---|---|
| 5,275,330 A | * | 1/1994 | Isaacs et al. | 228/180.21 |
| 5,656,798 A | * | 8/1997 | Kubo et al. | 174/265 |
| 5,734,560 A | * | 3/1998 | Kamperman et al. | 361/774 |
| 6,076,726 A | * | 6/2000 | Hoffmeyer et al. | 228/180.22 |
| 6,199,273 B1 | * | 3/2001 | Kubo et al. | 29/843 |
| 6,252,779 B1 | * | 6/2001 | Pierson et al. | 361/774 |
| 6,300,578 B1 | | 10/2001 | Hoffmeyer et al. | |
| 6,444,924 B1 | * | 9/2002 | Ishida et al. | 174/262 |
| 6,583,517 B1 | * | 6/2003 | Jimarez | 257/781 |

* cited by examiner

*Primary Examiner*—Evan Pert
*Assistant Examiner*—I B Patel
(74) *Attorney, Agent, or Firm*—Schwabe, Williamson & Wyatt, P.C.

(57) ABSTRACT

A substrate has at least one via-in-pad that includes a bond pad and a bore. In addition, the substrate has a plug coupled to the at least one via-in-pad, the plug has a first conductive material and adapted to couple with a solder ball having a second conductive material, the first conductive material having a higher reflow temperature than the second conductive material.

8 Claims, 5 Drawing Sheets

APPARATUS AND METHODS FOR INTERCONNECTING COMPONENTS TO VIA-IN-PAD INTERCONNECTS

FIELD OF THE INVENTION

The present invention relates to electrical assemblies and, more particularly, to substrate and methods for providing via-in-pad electrical interconnects to facilitate high-performance and high-density component interconnection.

BACKGROUND OF INVENTION

It is common that electrical assemblies comprise at least one substrate that is used as a structural platform as well as to electrically interconnect one electrical component with another. The substrate is commonly a relatively rigid panel that comprises a variety of electrical interconnects that run through, within, and/or upon the panel. Examples of substrates include, but are not limited to, printed circuit boards (PCB), motherboards, and carrier substrates within microelectronic packages.

One long-standing method of attachment of an electrical component to the substrate is the well established process of providing the substrate with metalized through-bores, referred to as vias, through which corresponding pins on the electrical component are inserted, and subsequently soldered from the opposite side of the substrate. Through-bore vias are the most economical via type from a substrate manufacturing perspective. With the advent of new manufacturing technologies that do away with the pins on the electrical component, there have been attempts to continue to use the relatively inexpensive through-bore via substrates with these pin-less components.

One method of interconnecting electrical components to the substrate, or one substrate to another substrate, incorporates surface mount technology (SMT). The SMT electrical component replaces the pin or wire contacts with simple, flat electrical interconnect known as land pads. Surface mount technology electrical components are widely used because of their compact size and simplicity of interconnection doing away with such issues as pin alignment and bulkiness. Examples of SMT electrical components include, but are not limited to, flip chip-ball grid array (FC-BGA) packaging and chip-scale packaging.

FIG. 1 is a cross-sectional view of a VIP substrate 10 which comprises a type of electrical interconnect known in the art as a via-in-pad (VIP) 20. The VIP 20 is a modification of the standard through-bore via substrate. As is with the standard through-bore via substrate, the VIP 20 is a through-bore 16 extending through the thickness of a substrate core 18 with an electrically conductive liner 21 forming a VIP bore 22. FIG. 2 is a perspective view of the electrically conductive liner 21 shown without the substrate core 18 for clarity. In addition, the electrically conductive liner 21 also forms a first and second VIP bond pad 24,26 adjacent the through-bore 16 on a portion 13 of a first substrate surface 12 of the VIP substrate 10. The VIP bore 22 is also referred to as a via, hence the designation "via-in-pad".

With SMT electrical interconnect 9 replacing the pins, electrical components 8 require an electrical interconnect on the surface of the VIP substrate 10 that has sufficient surface area to provide for a satisfactory electrical interconnection. The first and second VIP bond pads 24,26 provide an expanded conductive contact surface to permit interconnection with the SMT electrical interconnect 9 using a reflowable electrically conductive interconnect material 28. Hence, the VIP bore 22 is not used and merely remains as a by-product of the established substrate manufacturing process.

The SMT electrical component-to-substrate interconnection is made using a reflow technique, for example, among others, the controlled collapse chip connection (C4) process. The C4 process is extensively used to interconnect a microelectronic die to a carrier substrate, but is equally applicable to other electrical component-to-substrate interconnection.

The C4 process involves providing reflowable electrically conductive interconnect material 28 on each SMT electrical interconnect 9. The electrical component 8 is positioned on top of the VIP substrate 10 such that the reflowable electrically conductive interconnect material 28 is in contact with the respective upwardly-facing first VIP bond pads 24. The assembly is processed at elevated temperature wherein the reflowable electrically conductive interconnect material 28 softens and/or melts to form an integral bond with the SMT electrical interconnects 9 and the first VIP bond pads 24. Upon cooling, the reflowable electrically conductive interconnect material 28 solidifies providing an electrical interconnection between the electrical component 8 and the VIP substrate 10.

The electrical interconnection between the SMT electrical interconnects 9 and the first VIP bond pads 24 is not without complications. One such complication is the migration of the molten reflowable electrically conductive interconnect material 28 into the VIP bore 22 by capillary action. If a sufficient amount of reflowable electrically conductive interconnect material 28 is drawn away from the first VIP bond pad 24 and into the VIP bore 22, there will be insufficient reflowable electrically conductive interconnect material 28 to make a proper interconnection.

One process that has been tried in the art to limit the amount of reflowable electrically conductive interconnect material 28 migrating into the VIP bore 22 involved plugging it with a soldermask plug 29. Soldermask material is deposited into the VIP bore 22 from the opposite side of the VIP substrate 10 intended to be interconnected. The soldermask plug 29 limits the amount of reflowable electrically conductive interconnect material 28 that can flow into the VIP bore 22, as well as blocks the flow out of the other side of the VIP bore 22.

The practice of plugging the opposite end of a VIP bore 22 creates additional problems effecting the electrical interconnection. As the reflowable electrically conductive interconnect material 28 is being heated to its melting point during the reflow process, volatiles in the soldermask material will reach their vapor point and be released as gasses. The expanding gasses can migrate into the molten reflowable electrically conductive interconnect material 28 causing a ballooning effect which may produce a weak or failed interconnection. Further, the ballooned reflowable electrically conductive interconnect material 28 may possibly make contact with adjacent VIPs 20 causing an electrical short.

For the reasons stated above, and for other reasons stated below which will become apparent to those skilled in the art upon reading and understanding the present specification, there is a significant need in the art for a substrate and a method for interconnecting electrical components to a substrate comprising VIP interconnects that offers relatively high density while providing a relatively high quality interconnection.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention.

Figure 3:
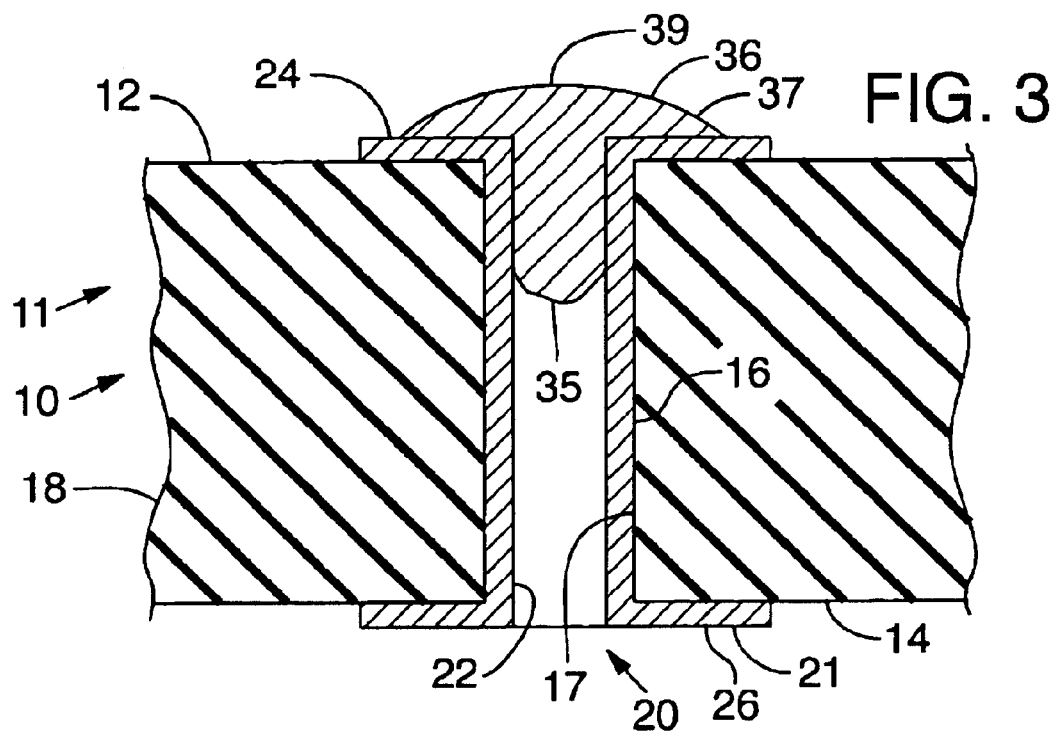
FIG. 3 is a cross-sectional view of a substrate comprising a VIP substrate, a VIP, and a VIP plug, in accordance with an embodiment of the invention.

FIG. 3 is a cross-sectional view of a VIP substrate 10 wherein each VIP 20 is provided with a VIP plug 39, in accordance with an embodiment of the invention. Each VIP plug 39 comprises a high reflow temperature first reflowable electrically conductive interconnect material 36. A reflow process is used to form an electrical interconnection between the first reflowable electrically conductive interconnect material 36 and the VIP 20. The reflow process is controlled to provide a VIP plug 39 in the form of a cap 37 and a stem 35. The cap 37 conforms to and covers a portion of the first VIP bond pad 24 and projects a predetermined distance above the first VIP bond pad 24 forming a rounded or dome-like cross-sectional profile. In one embodiment in accordance with the invention, the cap 37 covers from 40% to 60% of the diameter of the first VIP bond pad 24. The stem 35 extends from the cap 37 and conforms to and projects a predetermined distance into the VIP bore 22. The VIP plug 39 forms an integral bond and is electrically interconnected with the electrically conductive liner 21.

Figure 4:
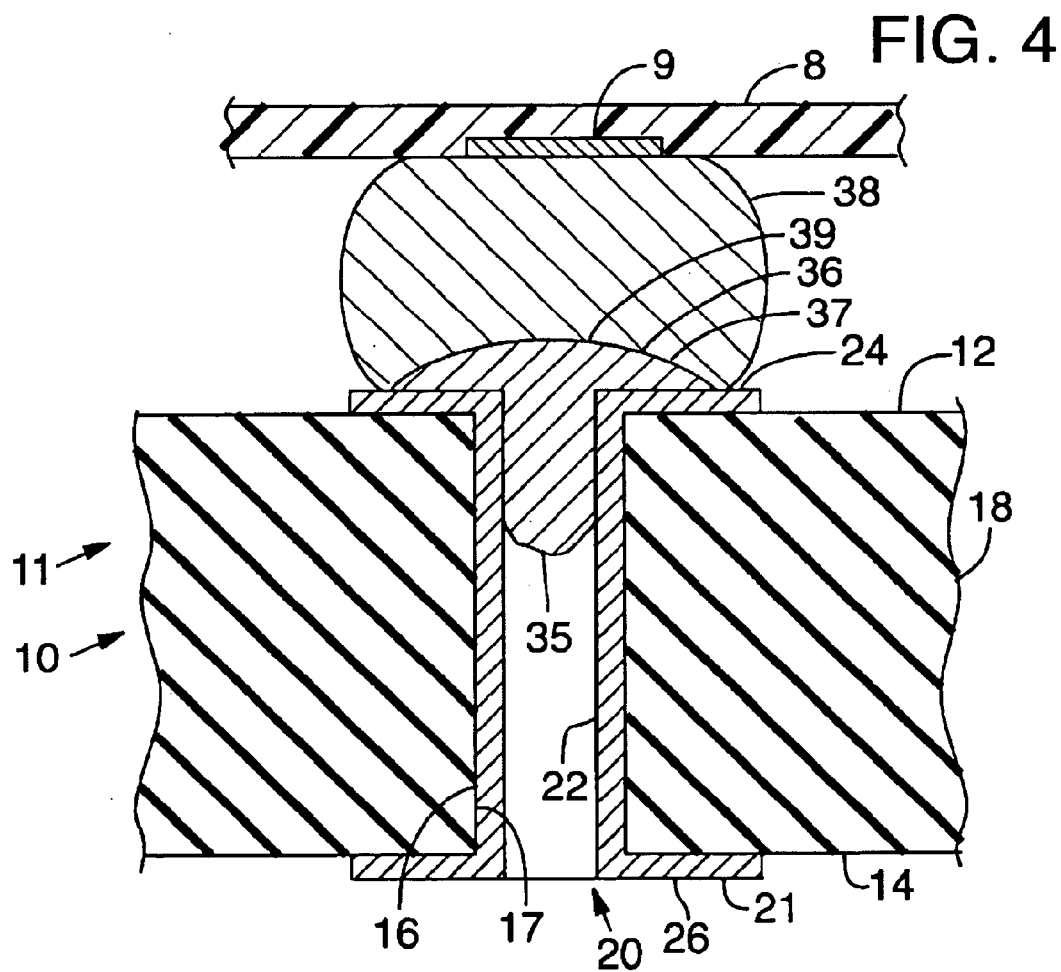
FIG. 4 is a cross-sectional view of an electrical component that has been electrically interconnected with the substrate, in accordance with an embodiment of the invention.

FIG. 4 is a cross-sectional view of an electrical component 8 that has been electrically interconnected with a VIP 20 and the VIP plug 39. The VIP plug 39 is provided on the side of the VIP substrate 10 adjacent the electrical component 8. A lower reflow temperature second reflowable electrically conductive interconnect material 38 is used to interconnect the SMT electrical interconnect 9 of the electrical component 8 with the exposed portion of the first VIP bond pad 24 and the cap 37 of the VIP plug 39. The lower-temperature second reflowable electrically conductive interconnect material 38 has a reflow temperature that is below the reflow temperature of the VIP plug 39, and therefore, the VIP plug 39 does not reflow, but remains in solid form, during the lower temperature reflow process.

The VIP plug 39 effectively prevents the migration of the lower temperature second reflowable electrically conductive interconnect material 38 away from the first VIP bond pad 24. The VIP 20 is therefore provided with a reliable interconnection that is not subject to migration of the second reflowable electrically conductive interconnect material 38 nor the detrimental effects of expanding gasses within the VIP bore 22 encountered with a soldermask plug 29.

Figure 5:
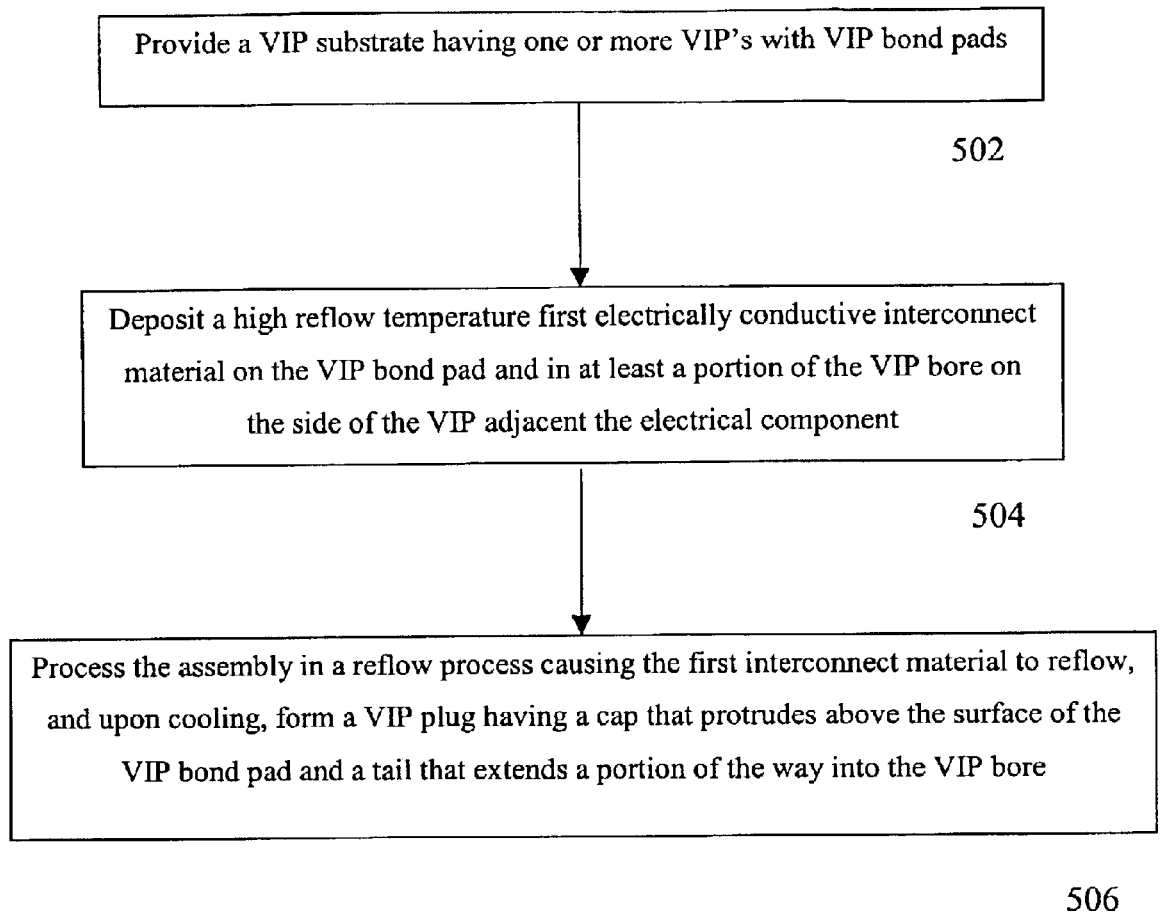
FIG. 5 is a flow diagram of a method for providing a plug to the VIP of a VIP substrate, in accordance with an embodiment of the invention.

FIG. 5 is a flow diagram of a method for providing a plug to the VIP of a VIP substrate, in accordance with an embodiment of the invention. A VIP substrate is provided having one or more VIP's 502. A high reflow temperature first electrically conductive interconnect material is deposited on the VIP bond pad and in at least a portion of the VIP bore on the side of the VIP adjacent the electrical component 504. The assembly is subjected to a reflow process causing the first interconnect material to reflow, and upon cooling, form a plug having a cap that protrudes above the surface of the VIP bond pad and a stem that extends a portion of the way into the VIP bore 506.

Referring to FIG. 4, the provided VIP substrate 10 is produced using known techniques. The VIP substrate 10 comprises a substrate core 18 of suitable dielectric material for the intended purpose, including, but not limited to, organic materials such as polyimide, as well as silicon, glass, quartz, ceramic, and the like. The substrate core 18 comprises a plurality of through-bores 16 that pass through the thickness of the substrate core 18. The through-bores 16 can be formed in the VIP substrate 10 in a number of ways, including, but not limited to, mechanical methods such as drilling, as well as with the use of energy, such as with a laser.

The VIP 20 comprises an electrically conductive liner 21 provided on an inner bore surface 17 of the through-bore 16. The electrically conductive liner 21 defines a VIP bore 22 as well as first and second VIP bond pads 24,26 on a portion of the first and second substrate surface 12,14 adjacent the through-bore 16. The electrically conductive liner 21 comprises any electrically conductive material suitable for the intended purpose. Examples of materials known in the art include, but are not limited to, copper and tungsten. In one embodiment in accordance with the present invention, the VIP bore 22 is provided with a plating of nickel to enhance the electrical interconnection between the electrically conductive liner 21 and the VIP plug 39.

A number of methods can be used to deposit the first reflowable electrically conductive interconnect material 36 on the VIP 20. The methods include, but are not limited to, printing, dispensing, and placement. For example, interconnect material in the form of paste can be silk-screened or dispensed through a needle-type applicator. Solid interconnect material preformed in a plug-like shape can be placed with a pick and place machine. The method of depositing the first reflowable electrically conductive interconnect material 36 onto the VIP 20 will depend on the specific configuration of the system.

Figure 6:
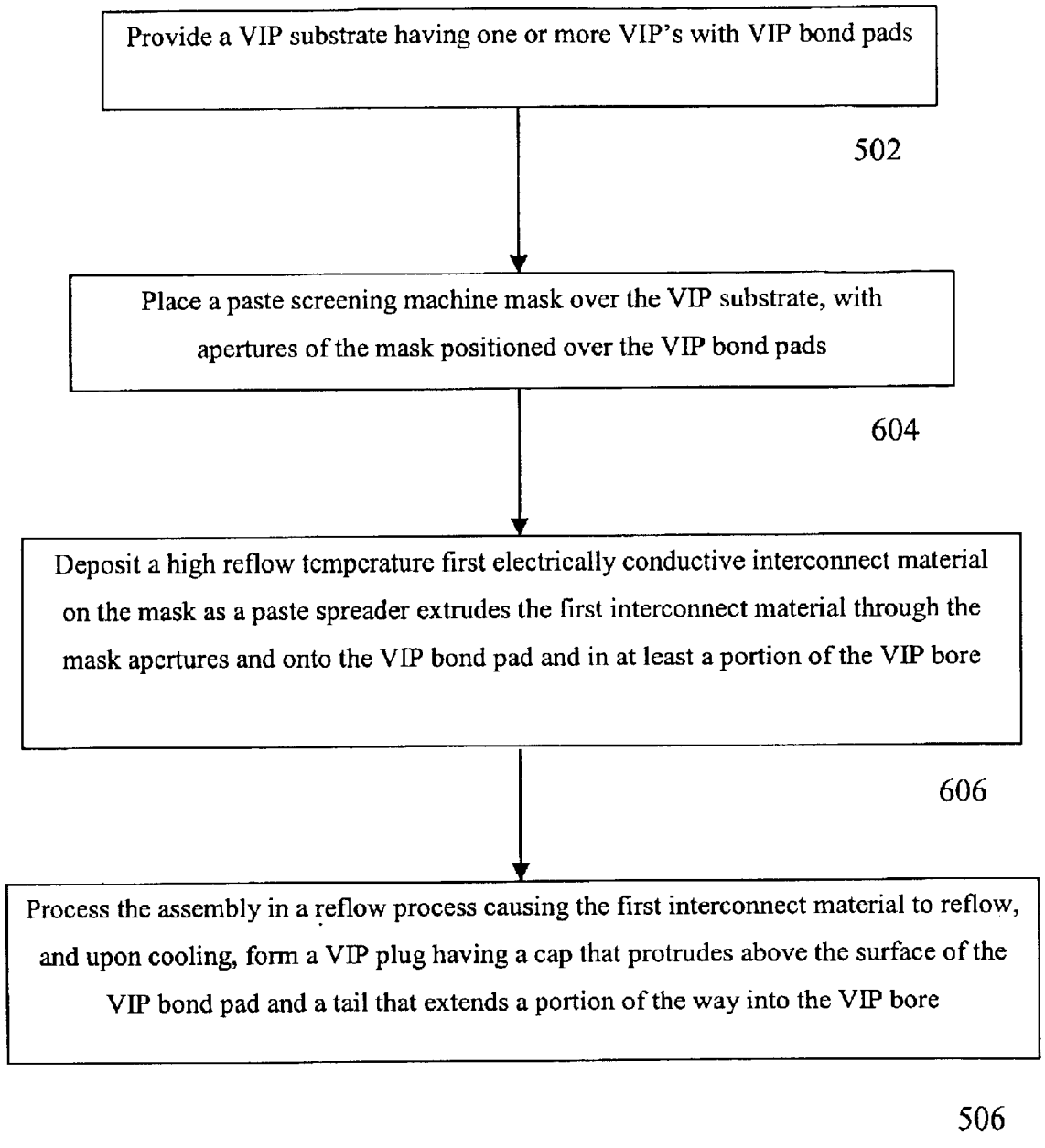
FIG. 6 is a flow diagram of a printing method for depositing the first interconnect material on the VIP, in accordance with an embodiment of the invention.

FIG. 6 is a flow diagram of a printing method for depositing the first interconnect material on the VIP, in accordance with an embodiment of the invention. A VIP substrate is provided having one or more VIP's 502. A paste screening machine mask is placed over the VIP substrate, with apertures of the mask positioned over the VIP bond pads 604. A high reflow temperature first electrically conductive interconnect material is deposited on the mask as a paste spreader extrudes the first interconnect material through the mask apertures and onto the VIP bond pad and in at least a portion of the VIP bore 606. The assembly is subjected to a reflow process causing the first interconnect material to reflow, and upon cooling, form a plug having a cap that protrudes above the surface of the VIP bond pad and a stem that extends a portion of the way into the VIP bore 506.

Figure 7:
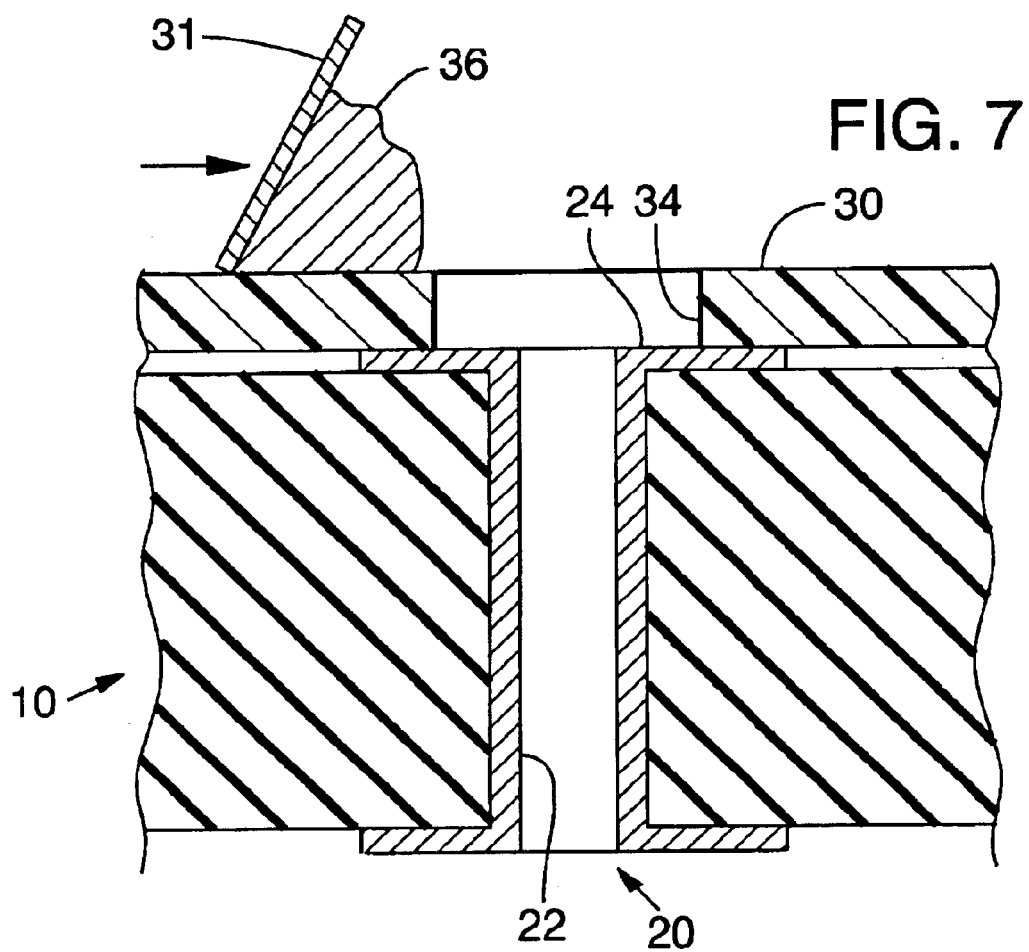
FIG. 7 is a cross-sectional view of the VIP undergoing the printing of a first interconnect material onto the VIP bond pad and in the VIP bore, in accordance with an embodiment of the invention.

FIG. 7 is a cross-sectional view of the VIP 20 undergoing the printing of a first reflowable electrically conductive interconnect material 36 onto the first VIP bond pad 24 and in the VIP bore 22, in accordance with an embodiment of the invention. A mask 30 of a paste screening machine is provided comprising an aperture 34 of approximately the same shape and size as the first VIP bond pad 24 for each of the first VIP bond pads 24 of interest. VIP substrates 10 commonly comprise a plurality of VIPs 20, and, correspondingly, a plurality of respective apertures 34 in the mask 30 is provided.

For simplicity of illustration, FIG. 7 shows one VIP 20 with a corresponding aperture 34. The aperture 34 of the mask 30 is aligned or registered with and placed directly over the first VIP bond pad 24. The first reflowable electrically conductive interconnect material 36 is provided with a consistency appropriate for spreading and/or extruding through the aperture 34 of the mask 30. A device 31 much like a squeegee sweeps and directs the first reflowable electrically conductive interconnect material 36 through the aperture 34 and onto the first VIP bond pad 24 and partially into the VIP bore 22.

Figure 8:
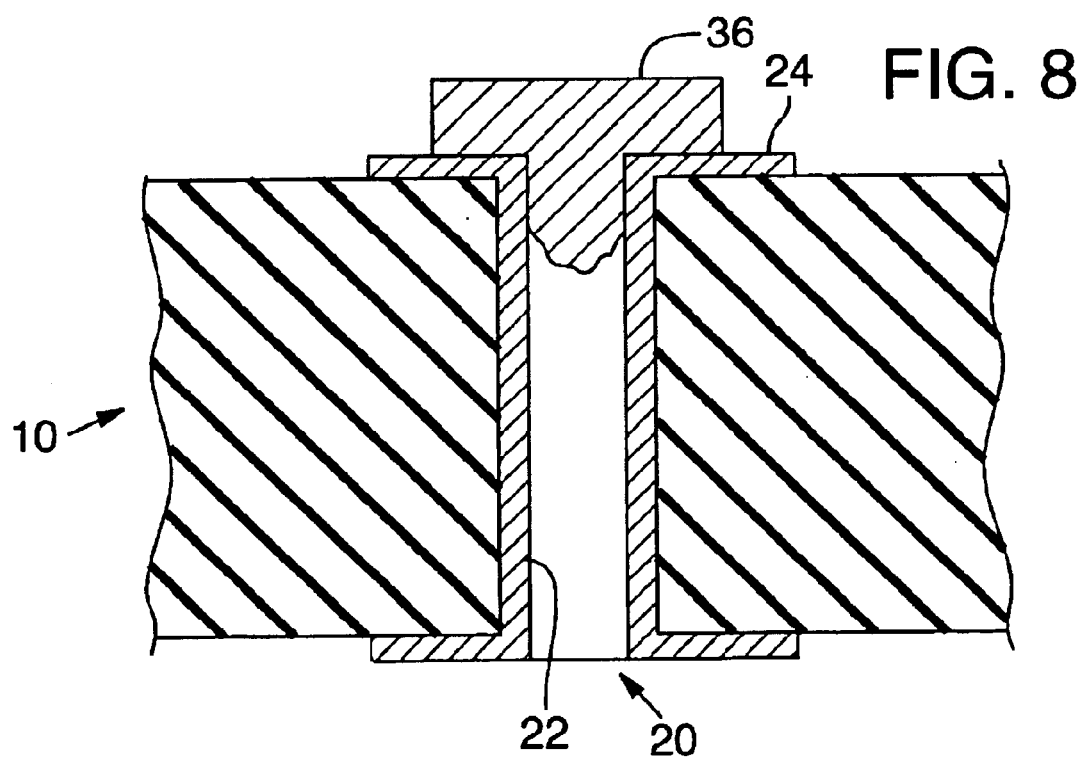
FIG. 8 is a cross-sectional view of the VIP after having undergone the printing of the first interconnect material.

FIG. 8 is a cross-sectional view of the VIP 20 after having undergone the printing of the first reflowable electrically conductive interconnect material 36. The mask 30 is remove leaving a deposition of the first reflowable electrically conductive interconnect material 36 onto the first VIP bond pad 24 and in the VIP bore 22. The first reflowable electrically conductive interconnect material 36 substantially overlies and partially protrudes into the VIP bore 22. It has been found that a layer of first reflowable electrically conductive interconnect material 36 having a thickness of about 0.003 to 0.005 inches (75 to 130 microns) provides satisfactory results. A thickness of the first reflowable electrically conductive interconnect material 36, either lower or higher, is anticipated and within the scope of the invention to meet the needs of specific package configurations and conditions. One such condition that will effect the thickness of the deposition of the first reflowable electrically conductive interconnect material 36 includes, but is not limited to, the size of the VIP bore 22.

Figure 1:
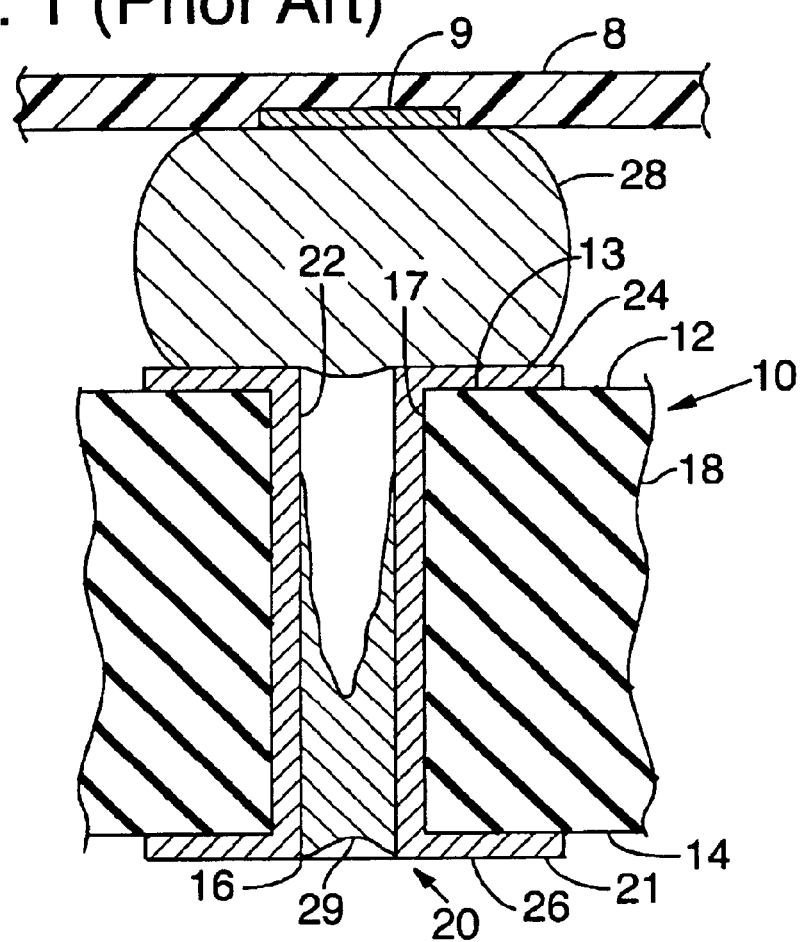
FIG. 1 is a cross-sectional view of a known substrate comprising a type of electrical interconnect known in the art as a via-in-pad (VIP)
Figure 2:
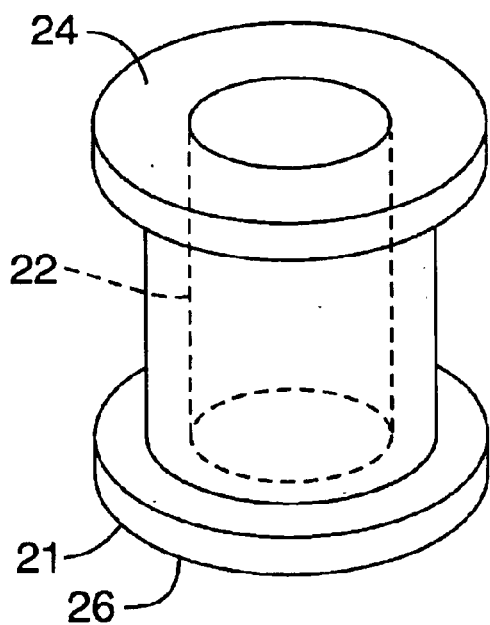
FIG. 2 is a perspective view of the electrically conductive liner shown without the substrate core.
Figure 9:
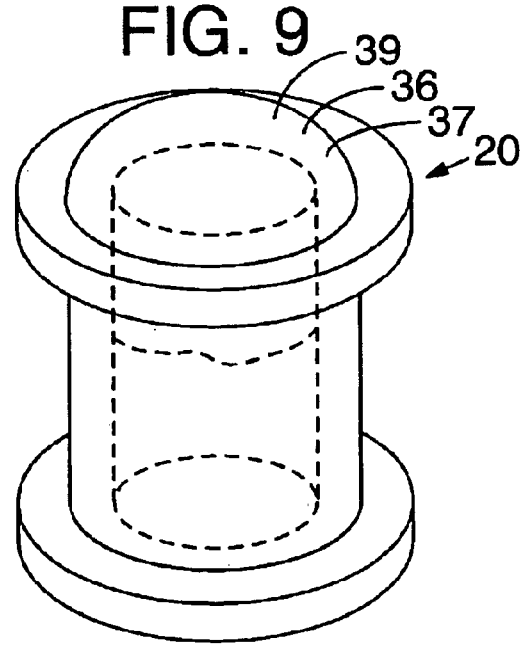
FIG. 9 is a perspective view of the VIP and first interconnect material after having undergone a reflow process, in accordance with an embodiment of the invention.

FIGS. 3 and 9 are cross-sectional and perspective views, respectively, of the VIP 20 and first reflowable electrically conductive interconnect material 36 after having undergone a reflow process to form a plugged VIP substrate 11. The reflow process comprises heating the assembly to a temperature wherein the first reflowable electrically conductive interconnect material 36 becomes soft and effectively flows to conform to the geometry of the VIP bore 22 and form an integral electrical bond therewith. The temperature is controlled such as to not permit the first reflowable electrically conductive interconnect material 36 to migrate away from the placement location. A portion of the first reflowable electrically conductive interconnect material 36 remains protruding out of and above the VIP bore 22 forming a cap 37 upon cooling.

Referring again to FIG. 4, a cross-sectional view of a plugged VIP substrate 11 comprising a VIP plug 39 wherein the VIP 20 is coupled to a SMT electrical interconnect 9 of an electrical component 8 with a second reflowable electrically conductive interconnect material 38 is shown, in accordance with an embodiment of the invention. The plugged VIP substrate 11 and the electrical component 8 form an electrical assembly that can be used as a part of an electrical system.

In one embodiment, the electrical component 8 is a SMT electrical component, such as, but not limited to, a ball grid array package. The second reflowable electrically conductive interconnect material 38 is in the form of a ball of solder attached to the SMT electrical interconnect 9 of the electrical component 8. The electrical component 8 is registered over the VIP substrate 10 with the VIP plug 39 such that the second reflowable electrically conductive interconnect material 38 is positioned over the first VIP bond pad 24 and the VIP plug 39. The assembly is processed such that the second reflowable electrically conductive interconnect material 38 undergoes reflow but the first reflowable electrically conductive interconnect material 36 remains solid. The second reflowable electrically conductive interconnect material 38 forms an electrical interconnection with the first VIP bond pad 24 and the VIP plug 39 upon cooling.

A reflowable electrically conductive interconnect material commonly used in the C4 process, and which is suitable for use as the second electrically conductive interconnect material 38 in accordance with an embodiment of the invention, is a tin-based solder comprising 37% lead (Sn/37Pb solder) having a melting temperature of 183C. A typical reflow temperature for Sn/37Pb solder is 205C. In accordance with the present invention, a first reflowable electrically conductive interconnect material 36 having a higher reflow temperature is required for the VIP plug 39.

In accordance with an embodiment of the invention, the first reflowable electrically conductive interconnect material 36 comprises lead-free, tin-based solder of 3.5% silver (Sn/3.5Ag solder) with a melting temperature of 221C and a reflow temperature of 240C. In another embodiment in accordance with the invention, the first reflowable electrically conductive interconnect material 36 comprises lead-free, tin-based solder having 5% antimony (Sn/5Sb solder) with a melting temperature of 234C and a reflow temperature of 255C.

One can appreciate that since the VIP plug 39 remains solid throughout the reflow of the second reflowable electrically conductive interconnect material 38, migration of the first reflowable electrically conductive interconnect material 36 into the VIP bore 22 is prevented. For similar reasons, there also is no potential for the first reflowable electrically conductive interconnect material 36 to be exposed to trapped volatile gases from within the VIP bore 22. This effectively eliminates the potential for gas entrapment within the interconnect bond, potentially causing interconnect failure, such as shorting or de-coupling of the second reflowable electrically conductive interconnect material 38 from the first VIP bond pad 24.

The benefit of the VIP plug 39 was experimentally verified. A number of standard VIP substrates 10 having a plurality of VIP's 20, such as shown in FIG. 7, was manufactured according to standard practice. VIP plugs 39 were formed in the VIP's 20 using the process described in FIG. 6. The first reflowable electrically conductive interconnect material 36 used consisted of Sn/3.5Ag solder. The average height/thickness of the Sn/3.5Ag solder cap 37 was about 0.003 to 0.005 inches (75 to 130 microns) with a diameter of 40% to 70% of the first VIP bond pad 24 diameter. An electrical component 8 was interconnected to the first VIP bond pad 24 and VIP plug 39 with Sn/37Pb solder as the second reflowable electrically conductive interconnect material 38 using standard SMT assembly process, forming a FC-BGA package.

The package was evaluated for interconnect quality. The higher reflow temperature Sn/3.5Ag solder VIP plug 39 was sufficient to prevent Sn/37Pb solder migration away from the first VIP bond pad 24 and VIP plug 39. Also, there was no evidence of out-gassing and it's associated poor interconnection quality.

The plugged VIP substrate 11 comprising a VIP substrate 10 and VIP plugs 39 can be utilized in many applications which require the interconnection of electrical components with a VIP substrate 10. Examples of electrical components 8 that can be electrically interconnected with VIP's 20 with VIP plugs 39 include, but are not limited to, microprocessors or microcontrollers, memory circuits, application specific integrated circuits (ASIC), digital signal processors (DSP), radio frequency circuits, amplifiers, power converters, filters, clocking circuits, passive elements such as inductors, capacitors, and resistors, and the like. Examples of electrical assemblies that can take advantage of the benefits of the plugged VIP substrate 11 include, but are not limited to, integrated circuit packages and semiconductor device packages.

In other embodiments in accordance with the present invention, the VIP substrate 10 with VIP plugs 39 is a component of an electrical system. An electrical system is broadly defined herein as any product comprising an electrical assembly. Examples of electrical systems include, but are not limited to, computers (e.g., desktop, laptop, handheld, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, etc.), and the like.

It is understood and appreciated that the VIP substrate 10 with VIP plugs 39 may not necessarily be used exclusively for electrical communication between electrical components. The VIP substrate 10 with VIP plugs 39 can also be utilized, for example, but not limited to, as an interconnect from the substrate to a heatsink for thermal dissipation. Therefore, the apparatus and methods for the interconnection of other components and the VIP substrate 10 with VIP plugs 39 is also within the scope of the present invention.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A substrate assembly, comprising:

a substrate;

at least one via-in-pad in the substrate, the at least one via-in-pad comprising a bond pad and a bore; and a plug coupled to the at least one via-in-pad, the plug comprises a first conductive material and connected with a solder ball comprising a second conductive material, the first conductive material having a higher reflow temperature than the second conductive material, the plug comprises a cap and a stem, the cap conforming to the bond pad and having a predetermined thickness and a diameter larger than the diameter of the bore, and the stem conforming to the diameter of the bore and extending from the cap into the bore a predetermined distance.

2. The substrate assembly of claim 1, wherein the cap has an average thickness from about 0.003 to 0.005 inches (75 to 130 microns) with a diameter of about 40% to 70% of the diameter of the bond pad.

3. The substrate assembly of claim 1, wherein the first conductive material is a material selected from the group consiting of a tin-based solder of 3.5% silver (Sn/3.5Ag solder) and a tin-based solder having 5% antimony (Sn/5Sb solder).

4. The substrate assembly of claim 3, wherein the second conductive material comprises tin-based solder comprising 37% lead (Sn/37Pb solder).

5. An electrical device, comprising:

an electrical component;

a substrate having at least one via-in-pad, the at least one via-in-pad comprises a bond pad and a bore;

a solder ball coupled to the electrical component, the solder ball comprises a second conductive material; and a plug coupled to the at least on via-in-pad and the solder ball, the plug comprises a first conductive material, the first conductive material having a higher reflow temperature than the second conductive material, the plug comprises a cap and a stem, the cap conforming to the bond pad and having a predetermined thickness and a diameter larger than the diameter of the bore, the stem conforming to the diameter of the bore and extending from the cap into the bore a predetermined distance.

6. The electrical device of claim 5, wherein the cap has an average thickness from about 0.003 to 0.005 inches (75 to 130 microns) with a diameter of about 40% to 70% of the diameter of the bond pad.

7. The electrical device of claim 5, wherein the first conductive material is a material delected from the group consisting of a tin-based solder of 3.5% silver (Sn/3.5Ag solder) and a tin-based solder having 5% antimony (Sn/5Sb solder.

8. The electrical device of claim 7, wherein the second conductive material comprises tin-based solder comprising 37% lead (Sn/37Pb solder).

* * * * *

UNITED STATES PATENT AND TRADEMARK OFFICE
CERTIFICATE OF CORRECTION

PATENT NO. : 6,828,512 B2
DATED : December 7, 2004
INVENTOR(S) : Chung et al.

It is certified that error appears in the above-identified patent and that said Letters Patent is hereby corrected as shown below:

Column 8,
Line 25, "consiting of a…" should read -- consisting of a… --;
Line 38, "…at least on…" should read -- …at least one… --;
Line 52, "…material delected from…" should read -- …material selected from… --; and
Line 55, "solder." should read -- solder). --.

Signed and Sealed this

Twenty-fourth Day of January, 2006

JON W. DUDAS
*Director of the United States Patent and Trademark Office*